(12) United States Patent
Kim et al.

(10) Patent No.: US 7,040,336 B2
(45) Date of Patent: May 9, 2006

(54) GAS DELIVERY SYSTEM FOR SUPPLYING GAS TO SEMICONDUCTOR MANUFACTURING EQUIPMENT

(75) Inventors: Yu-kweon Kim, Kyungki-do (KR); Seung-ki Chae, Seoul (KR); Jai-kang Jeon, Kyungki-do (KR); Young-seok Roh, Kyungki-do (KR); Yong-wook Lee, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 399 days.

(21) Appl. No.: 10/666,734

(22) Filed: Sep. 18, 2003

(65) Prior Publication Data

US 2004/0123907 A1     Jul. 1, 2004

(30) Foreign Application Priority Data

Sep. 19, 2002  (KR) .................. 10-2002-0057455

(51) Int. Cl.
  *F16K 37/00*  (2006.01)
(52) U.S. Cl. .................... 137/1; 137/312; 137/552; 700/82; 700/282
(58) Field of Classification Search .............. 137/1, 137/312, 552; 118/715; 700/21, 82, 282
  See application file for complete search history.

(56) References Cited

U.S. PATENT DOCUMENTS

| | | | | |
|---|---|---|---|---|
| 3,377,623 A | * | 4/1968 | Reut et al. | 700/82 |
| 4,635,209 A | * | 1/1987 | Hwang et al. | 700/290 |
| 5,748,470 A | * | 5/1998 | Hager et al. | 700/82 |
| 6,216,051 B1 | * | 4/2001 | Hager et al. | 700/82 |
| 6,314,986 B1 | * | 11/2001 | Zheng et al. | 137/240 |
| 6,516,249 B1 | * | 2/2003 | Hoyle et al. | 700/282 |

* cited by examiner

*Primary Examiner*—John Rivell
(74) *Attorney, Agent, or Firm*—Marger Johnson & McCollom, P.C.

(57) ABSTRACT

A gas delivery system for providing a gas to manufacturing equipment includes a gas supply unit for providing the gas to the manufacturing equipment including devices to regulate the supply of gas from the gas supply unit to the manufacturing equipment. The system includes a main control unit for regulating the supply of the gas to the manufacturing equipment. The gas delivery system includes a supplemental control unit which receives an emergency shutdown signal from the main control unit for closing off the supply of gas in response to a malfunction of the main control unit and generates a signal for maintaining a gas flow to operate the manufacturing equipment until the cause of the malfunction has been determined. With the system, an unnecessary emergency shutdown of gas supply to semiconductor manufacturing equipment in response to a malfunction of a main controller can be prevented.

22 Claims, 5 Drawing Sheets

GAS DELIVERY SYSTEM FOR SUPPLYING GAS TO SEMICONDUCTOR MANUFACTURING EQUIPMENT

This application claims the priority of Korean Patent Application No. 2002-57455, filed on Sep. 19, 2002, in the Korean Intellectual Property Office, the disclosure of which is incorporated herein in its entirety by reference.

BACKGROUND OF THE INVENTION

1. Field of the Invention

The present invention relates to gas delivery systems for supplying a gas required for manufacturing semiconductor devices. More specifically, the present invention relates to a gas delivery system having a non-shutdown function for preventing an unwanted shutdown.

2. Description of the Related Art

Manufacturing equipment, such as equipment to manufacture semiconductor devices, use various types of fluids such as gases. For example, semiconductor manufacturing equipment requires a gas delivery system for supplying a gas during a production of semiconductor devices. The reliability of a gas delivery system, such as a cylinder cabinet, is known to have a direct influence on the rate of operation of semiconductor manufacturing equipment which in turn affects overall productivity. Accordingly, it is very important to reliably operate the gas delivery system. Thus, various methods for reliably delivering a gas from a gas supply source to manufacturing equipment have been proposed.

In general, gas delivery systems or gas supplying apparatuses are categorized into different types, i.e., single delivery systems or auto delivery systems, according to the properties of the supplied gases. However, in recent years, the auto delivery systems, which enable automated gas supply, have been widely used in order to increase the rate of operation of semiconductor manufacturing equipment and improve overall productivity.

FIG. 1 is a schematic diagram illustrating a conventional gas delivery system. FIG. 2 is a schematic diagram illustrating an emergency shutdown of the conventional gas delivery system. Referring to FIGS. 1 and 2, a typical gas delivery system may comprise a main controller 10 and a gas supplier 20 (or a panel and pipeline unit).

The main controller 10 may include a programmable logic controller (PLC), in which a software program for controlling the gas supplier 20 is installed and operated. The main controller 10 controls the flow of gas from the gas supplier 20 to manufacturing equipment 30 where the manufacture of semiconductor devices are conducted.

Specifically, as shown in FIG. 2, the main controller 10 may include (a) a central processing unit (CPU) for performing operations of controlling gas supply, (b) a power supply for supplying power to the CPU, and (c) parts for transmitting and receiving signals, such as an analog signal unit, a digital signal input (D/I), and a digital signal output (D/O). The CPU controls the operations of the gas supplier 20 based on a predetermined operating program.

The operating status of the main controller 10 is displayed on a display unit 50, which is coupled to the CPU via RS232. Because the display unit 50 is a touch-screen type display, a worker can input a new command to the CPU of the main controller 10 using the display unit 50.

The main controller 10 controls various gas delivery paths installed in the gas supplier 20 so as to deliver a required gas to manufacturing equipment 30. For this, the main controller 10 controls operations of opening/closing off a plurality of valves included in the gas supplier 10. Here, the valves are air valves, which are remotely controlled by the main controller 10.

The gas supplier 20 comprises a plurality of gas containers (e.g., container A and container B of FIG. 1); on/off valves such as air valves (AV of FIG. 1) for distributing, turning on/off, and delivering a gas from the gas containers to the manufacturing equipment 30; pressure transducers (PT of FIG. 1); pressure regulators (REG of FIG. 1); and filters (LF of FIG. 1), which are coupled in a spool apparatus. Using selected parts of the gas supplier 20, the main controller 10 can determine gas pressure and the on/off status of the valves.

Referring to FIG. 1, each of the part included in the gas supplier 20 is driven by a program signal, which is set in the CPU of the main controller 10. For example, a gas contained in the container B is delivered along a gas delivery path to the manufacturing equipment 30. Initially, a valve 21 of the container B opens, pressure is primarily checked at PT1B 22, a gas is primarily filtered at LF1B 23, a first valve AV2B 24 opens, pressure is secondarily checked at PT3B 25, a second valve AV3B 26 opens, and a gas is secondarily filtered at LF2 27. The pipeline includes ¼" and ½" lines which are coupled to an end of the manufacturing equipment 30.

If gas leakage is detected along the gas delivery path or in the gas supplier 20, a gas leakage detector 40 generates a gas leakage signal. The gas leakage signal is transmitted through an interface box 45 to the main controller 10. Next, the main controller 10 transmits output signals for turning on a warning lamp 55, closing off all the valves of the gas supplier 20, and displaying an emergency shutdown state on the display unit 50. Such emergency shutdown results from a normal interlock function.

However, it is frequently reported that the emergency shutdown occurs merely in response to a malfunction of the main controller 10, not an emergency situation such as a gas leakage or the like. That is, when the CPU of the main controller 10 is incapacitated due to various internal/external factors, all the valves of the gas supplier 20 are shut down. In particular, both the first valve AV2B 24 and the second valve AV3B 26 of FIG. 1 are shut down, which leads to an immediate interruption of the gas supply to the manufacturing equipment 30.

In other words, when any malfunction or error is detected in the CPU of the main controller 10, the gas supply is immediately interrupted, and the manufacturing equipment 30 undergoes an emergency shutdown. As a result, the rate of operation of the manufacturing equipment 30 is sharply reduced.

However, when a non-urgent error or interruption in the flow of gas which does not constitute an emergency, such as a gas leakage, is detected in the main controller 10, it is preferable to keep supplying a gas to the manufacturing equipment 30 considering the consequences which result from a substantial decrease in the rate of operation of the manufacturing equipment 30.

SUMMARY OF THE INVENTION

The present invention provides, among other things, a gas delivery system by which when a malfunction occurs in a main control unit, an unnecessary emergency cessation of gas supply to semiconductor manufacturing equipment can be prevented and the rate of operation of such equipment can be improved.

In accordance with an aspect of the present invention, a gas delivery system comprises a subsidiary control unit with an auto recovery function for preventing an unnecessary emergency shutdown of gas supply to semiconductor manufacturing equipment.

In one embodiment, a gas delivery system for providing a gas to manufacturing equipment includes a gas supply unit for providing the gas to the manufacturing equipment including devices to regulate the supply of gas from the gas supply unit to the manufacturing equipment; a main control unit for regulating the supply of the gas to the manufacturing equipment. The gas delivery system further includes a supplemental control unit which receives an emergency shutdown signal from the main control unit for closing off the supply of gas in response to a malfunction of the main control unit and generates a signal for maintaining a gas flow to operate the manufacturing equipment until the cause of the malfunction has been determined.

According to another embodiment, the gas delivery system comprises a gas supply unit, which includes a gas delivery path used for supplying a gas to the semiconductor manufacturing equipment, a plurality of on/off valves installed in the gas delivery path to control the gas delivery path, and a gas container for containing the gas to be supplied through the gas delivery path; a main control unit, which controls gas supply such that the gas is supplied through the gas delivery path included in the gas supply unit to the manufacturing equipment; a subsidiary control unit having an auto recovery function, which receives from the main control unit an emergency shutdown signal for closing off the gas delivery path in response to a malfunction of the main control unit and generates a forcible opening signal for forcibly keeping the on/off valves open so as to allow for opening of the gas delivery path; and a warning unit, which warns a worker and allows the worker to decide whether or not the emergency shutdown signal is normally generated.

The emergency shutdown signal, generated from the main control unit, may comprise a command for closing off all the valves included in the gas supply unit. The subsidiary control unit allows the gas delivery path to stay until the worker decides to close off the gas delivery path.

The subsidiary control unit may be coupled to a signal output end of the main control unit such that as soon as the main control unit outputs the emergency shutdown signal, the subsidiary control unit receives the same.

The valves, which keep opening in response to the forcible opening signal from the subsidiary control unit, may be air valves for controlling the gas delivery path and valves for controlling the gas container.

The gas delivery system may further comprise a relay for independently supplying power to each of the subsidiary control unit and the main control unit. Alternatively, the gas delivery system may further comprise a subsidiary power supply for supplying power to the subsidiary control unit independently of the main control unit. Here, the subsidiary control unit may further comprise a warning lamp, which is coupled to the subsidiary power supply in order to warn a worker of forcible opening of the valves.

The warning unit may be a display unit or a warning lamp for displaying the operating status of the main control unit.

The gas delivery system may further comprise a gas leakage detection unit for sensing gas leakage from the gas delivery path and transmitting a gas leakage detection signal to the main control unit such that the main control unit generates the emergency shutdown signal. The gas delivery system may further comprise a plurality of other gas containers, other gas delivery paths for delivering each of the gas containers, and a plurality of on/off valves installed along the gas delivery paths to control the gas delivery paths.

According to yet another embodiment, the gas delivery system comprises a gas supply unit, which includes a gas delivery path used for supplying a gas to semiconductor manufacturing equipment, a gas container coupled to the gas delivery path to contain the gas to be supplied through the gas delivery path, a valve for the gas container for allowing the gas to flow from the gas container to the gas delivery path, and a plurality of on/off valves including at least a first valve and a second valve installed serially along the gas delivery path to control the flow of the gas through the gas delivery path; a main control unit, which controls gas supply such that the gas is supplied from the gas delivery path included in the gas supply unit to the manufacturing equipment; a subsidiary control unit having an auto recovery function, which receives an emergency shutdown signal from the main control unit and generates a forcible opening signal for forcibly keeping the first valve, the second valve, and the valve for the gas container open so as to allow minimal gas flow through the gas delivery path; and a warning unit, which warns a worker and allows the worker to decide whether or not the emergency shutdown signal is normally generated.

Here, the subsidiary control unit allows the first valve, the second valve, and the valve for the gas container to stay until the worker decides to close off the gas delivery path.

The gas delivery system according to the present invention can prevent unnecessary emergency shutdown of gas supply to semiconductor manufacturing equipment in response to a malfunction of a main control unit such as CPU.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art.

In embodiments of the present invention, a supplemental control unit is further installed in a gas delivery system with a main control unit. Even if a malfunction occurs in the main control unit, the subsidiary control unit enables a gas supply unit to keep operating without being affected by the malfunction. When a malfunction occurs in a gas delivery path or the main control unit, the main control unit first generates a command for immediately closing off the gas delivery path and then warns a worker of the malfunction.

When the main control unit generates the command for immediately closing off the gas delivery path, the subsidiary control unit can keep the gas delivery path open to allow a minimum amount of gas supply to continue to flow. Thus, manufacturing equipment can continue to operate without an emergency shutdown. Also, the worker can be warned of the malfunction and check whether or not the gas delivery path is damaged. If the gas delivery path is damaged, the gas delivery path is immediately closed off.

The gas delivery system according to the present invention can be applied not only to gas delivery systems, but also to systems for delivering chemical fluids.

Figure 1:
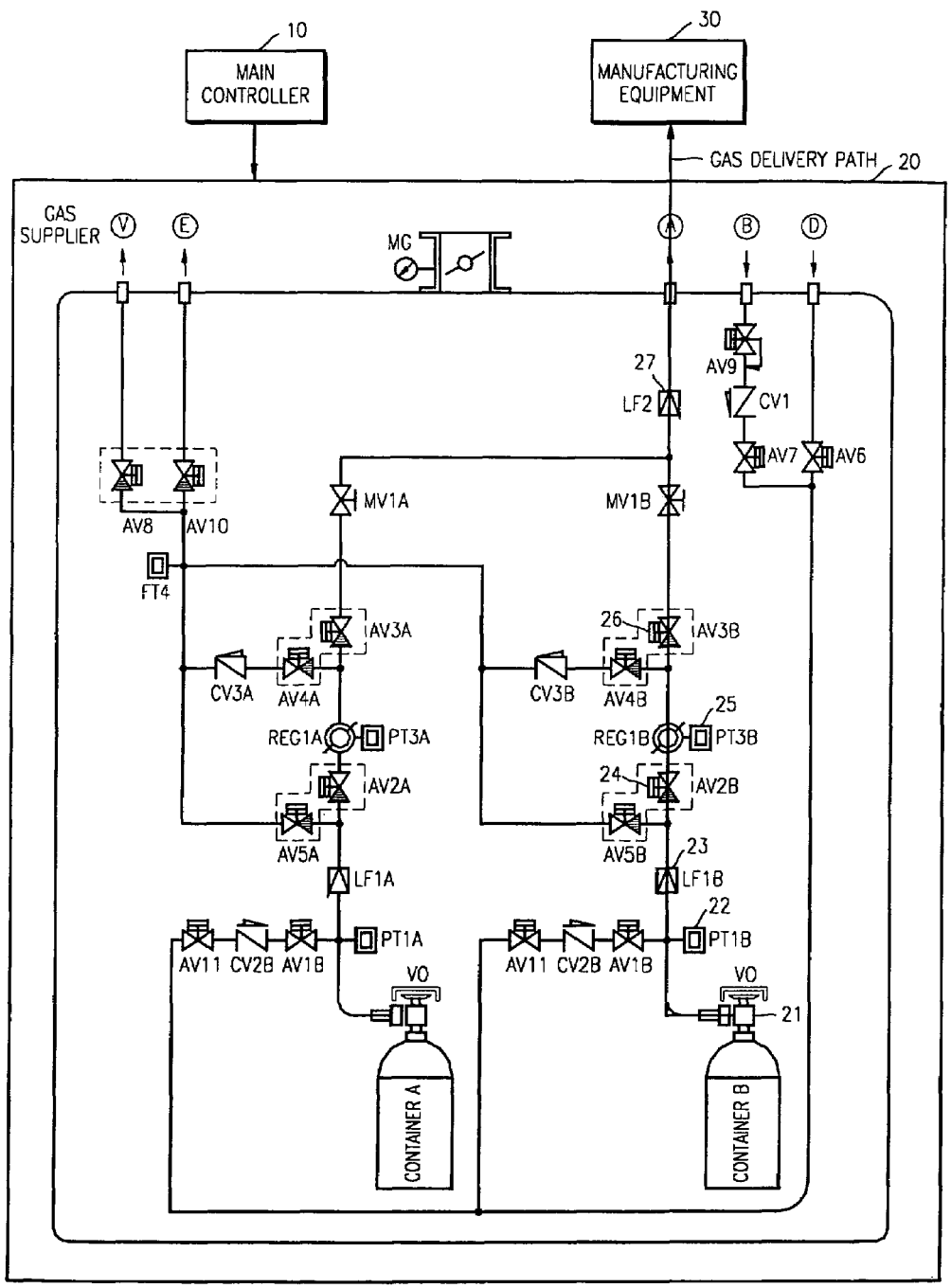
FIGS. 1 and 2 are schematic diagrams illustrating a conventional gas delivery system.
Figure 2:
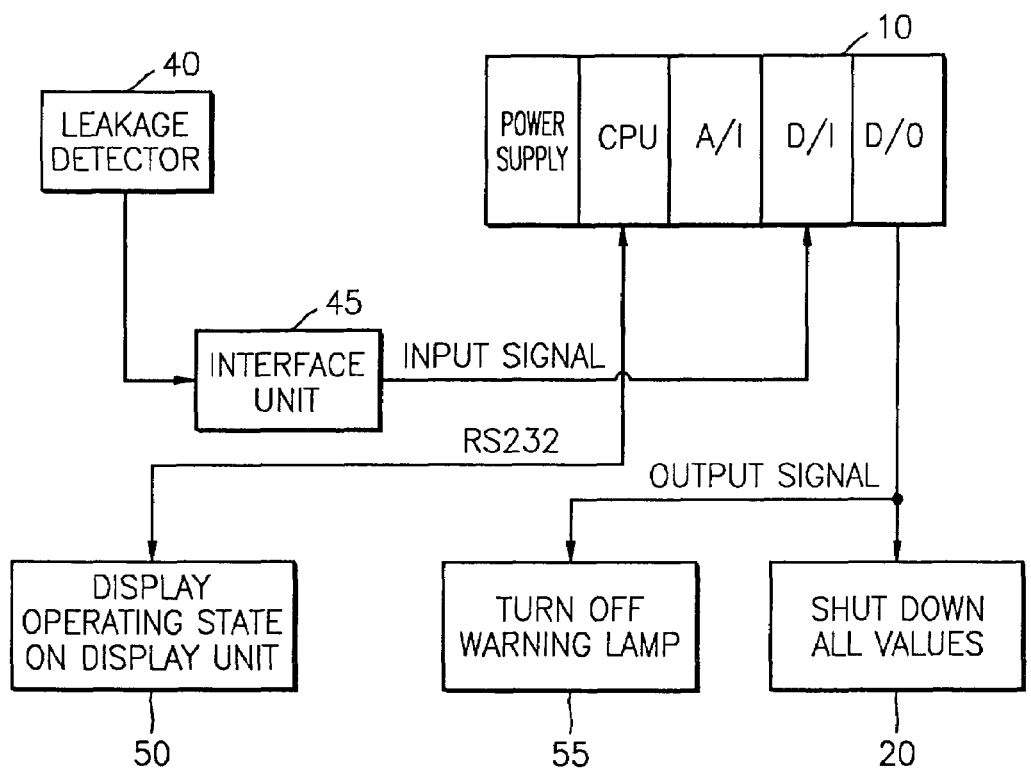
Figure 3:
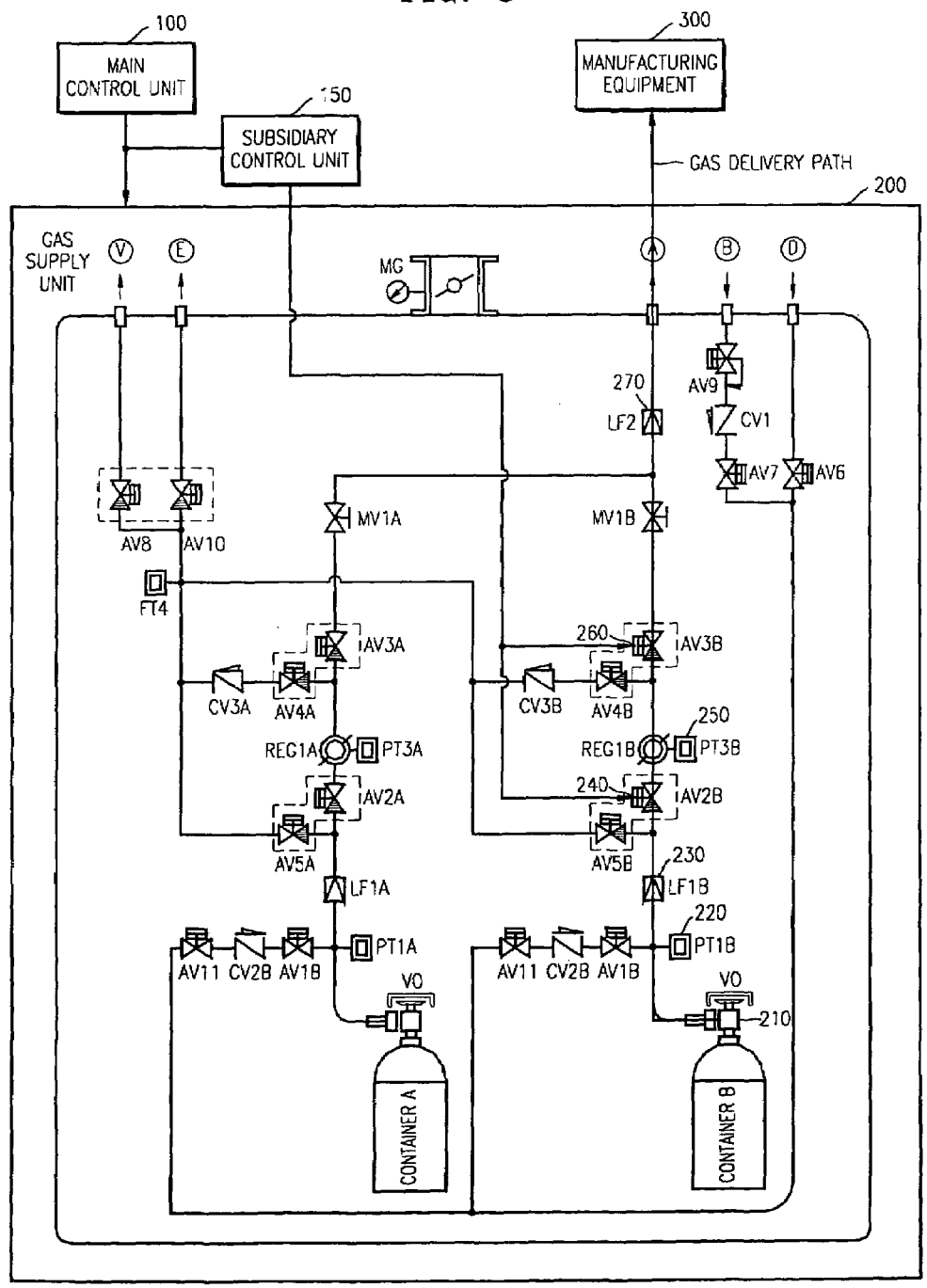
FIG. 3 is a schematic diagram illustrating a gas delivery system according to an embodiment of the present invention.
Figure 4:
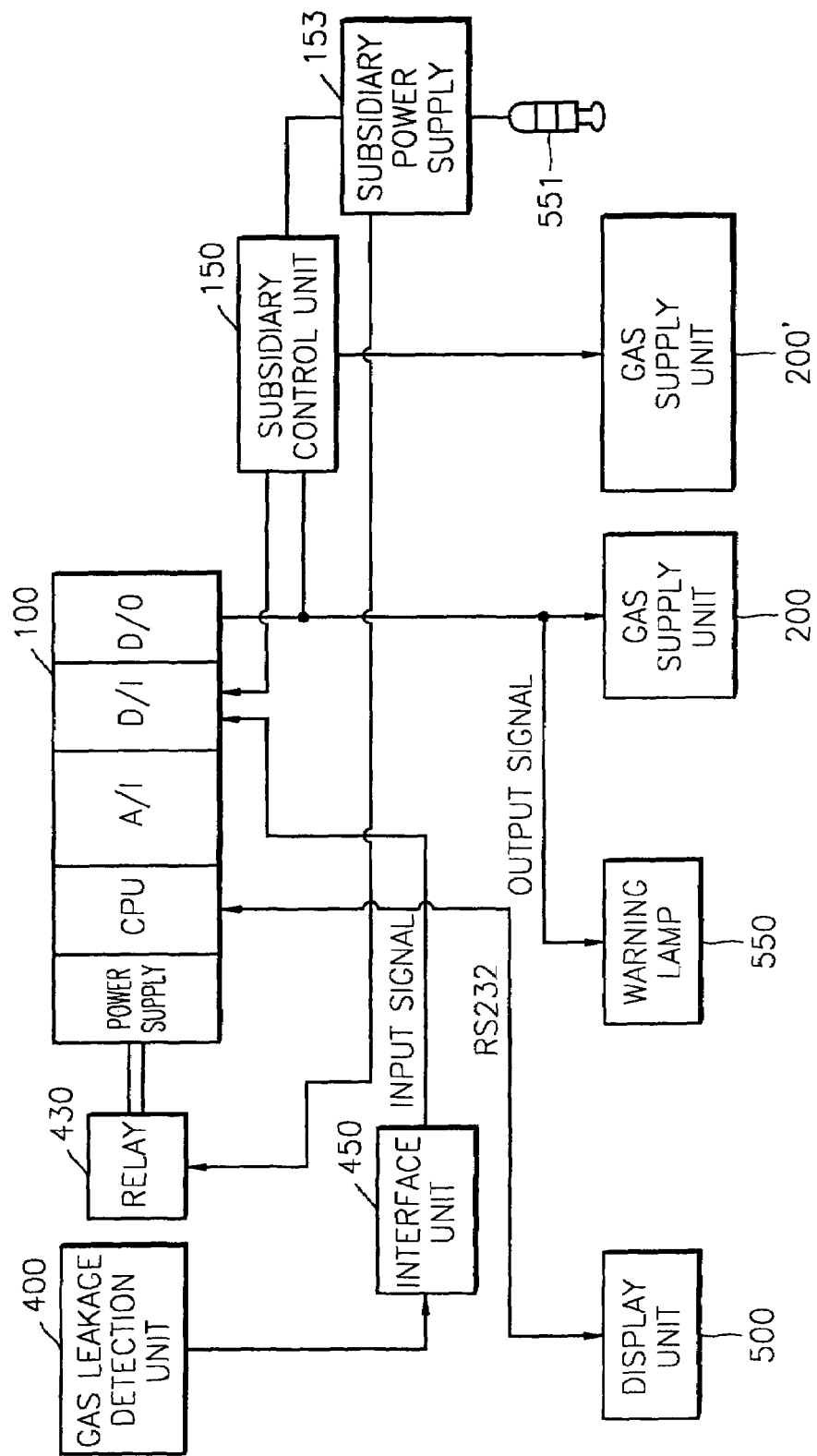
FIG. 4 is a schematic diagram illustrating functions of a subsidiary control unit in the gas delivery system according to the embodiment of the present invention.
Figure 5:
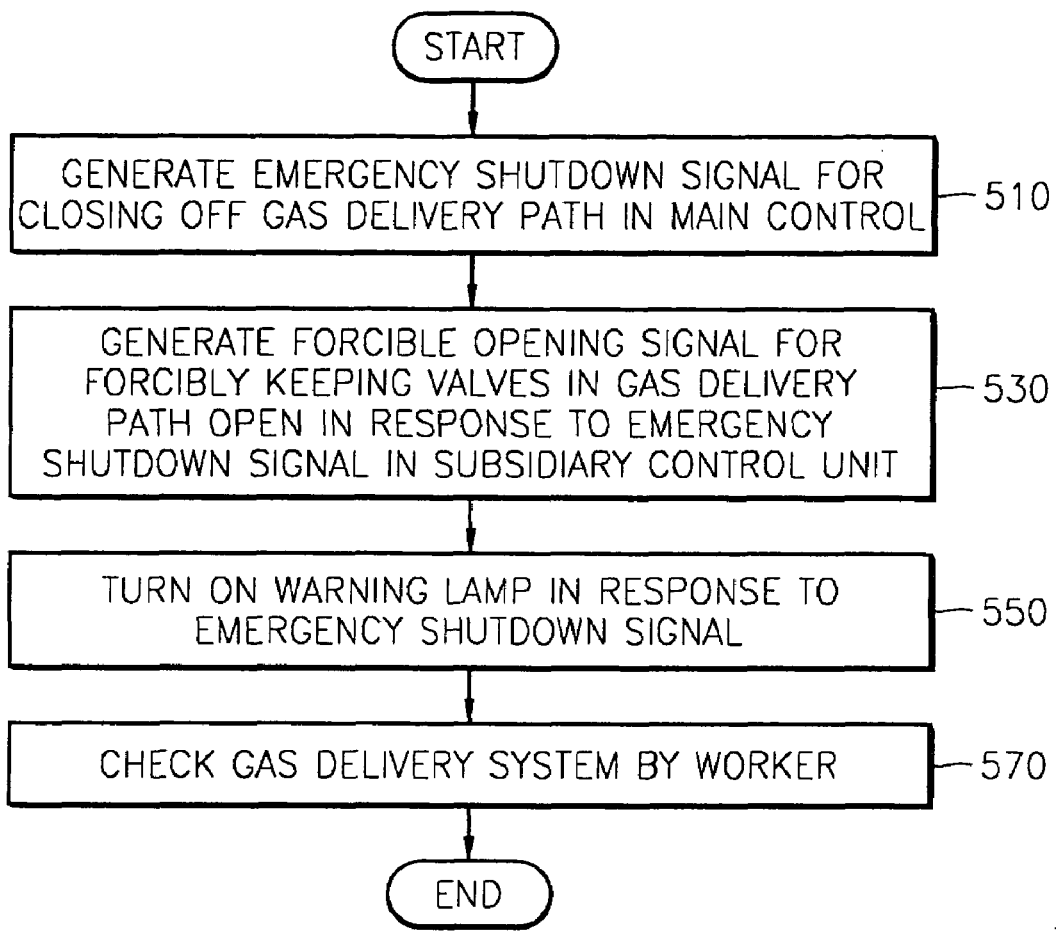
FIG. 5 is a schematic flowchart illustrating a controlling process of the subsidiary control unit in the gas delivery system according to the embodiment of the present invention.

FIG. 3 is a schematic diagram illustrating a gas delivery system according to an embodiment of the present invention. FIG. 4 is a schematic diagram illustrating functions of a subsidiary control unit in the gas delivery system according to the embodiment of the present invention. FIG. 5 is a schematic flowchart illustrating a controlling process of the subsidiary control unit in the gas delivery system according to the embodiment of the present invention.

Referring to FIGS. 3, 4, and 5, the gas delivery system according to the embodiment of the present invention comprises a main control unit 100, a supplemental control unit 150, and a gas supply unit 200 (or a panel unit).

The main control unit 100 may include the same PLC as in a typical gas delivery system and is used to control gas flow from the gas supply unit 200 to manufacturing equipment 300. For this, as shown in FIG. 4, the main control unit 100 may include a CPU for controlling gas supply, a power supply for supplying power to the CPU, and parts for transmitting and receiving signals, such as an analog input (A/I) signal unit, a digital signal input (D/I), and a digital signal output (D/I).

The CPU performs operations for controlling a variety of valves, pressure gauges, and filters, included in the gas supplier 200, based on a preset computer program. The operating status of the main controller 100 is displayed on a display unit 500, which is coupled to the CPU via RS232. The display unit 500, which is a touch-screen type display, can be used to input commands to the CPU of the main controller 100.

As in a typical gas delivery system, the main control unit 100 controls various gas delivery paths installed in the gas supply unit 200 such that a required gas is supplied to the manufacturing equipment 300. For this, the main control unit 100 turns on/off the plurality of valves installed in the gas supply unit 200 based on a preset computer program. The valves are air valves (AV), which are remotely controlled by the main controller 100. That is, the gas supplier 200 comprises a plurality of gas containers (e.g., a container A and a container B); various on/off valves such as air valves (AV) for distributing, turning on/off, and delivering a gas from the gas containers to the manufacturing equipment 300; pressure transducers (PT); pressure regulators (REG); filters (LF), which are coupled in a spool. Using the various components of the gas supplier 200, the main controller 100 can determine gas pressure and the on/off status of valves.

Referring to FIG. 3, each of the components included in the gas supplier 200 is driven by a program signal, which is set in the CPU of the main controller 100. For example, a gas contained in the container B can be delivered along a delivery path to the manufacturing equipment 300. Initially, a valve V0 210 of the container B opens, pressure is primarily checked at PT1B 220, a gas is primarily filtered at LF1B 230, a first valve AV2B 240 opens, pressure is secondarily checked at PT3B 250, a second valve AV3B 260 opens, and a gas is secondarily filtered at LF2 270. A pipeline includes ¼" and ½" lines and is coupled to one end of the manufacturing equipment 30.

If gas leakage occurs somewhere along the gas delivery path or in the gas supplier 200, a gas leakage detection unit 400 shown in FIG. 4 detects the gas leakage and transmits a gas leakage detection signal through an interface unit 450 to the main controller 10. Thus, the main controller 100 outputs, through a D/I signal unit output signals for turning on a warning lamp 550, closing off all the valves of the gas supplier 200, and displaying an emergency shutdown state on the display unit 500. Such emergency shutdown results from a normal interlock function. Thus, the gas delivery path including the gas supply unit 200 is immediately closed off.

In the present invention, the gas delivery system further comprises a supplemental control unit 150, which can supplement the functions of the main control unit 100 so as to allow a minimum amount of gas supply to continue to flow. The supplemental control unit 150 performs functions of sensing output signals from the main control unit 100. Also, when the main control unit 100 generates an emergency shutdown signal for closing off the gas delivery path, the supplemental control unit 100 generates a signal for maintaining in an open position valves in the gas delivery path open. To accomplish this, the supplemental control unit 150 includes a PLC in which those functions are programmed. For example, the supplemental control unit 150 according to the present invention can comprise a device manufactured by Mitshbishi Co., Ltd, and sold under the model designation FX2NC-32MT.

The PLC of the supplemental control unit 150 includes an independent supplemental power supply 153 which is independent from the power supply of the main control unit 100. Control unit 150 further includes a supplemental warning lamp 551 for informing a worker as to whether or not the supplemental control unit 150 is being actively driven. The driving power and the load current of the supplemental power supply 153 are DC 24V and 560 mA, respectively. The supplemental power supply 153 is separate from the power supply of the main control unit 100 by way of a relay 430, and is operated independently. The supplemental power supply 153 is used to operate the supplemental control unit 150 in a conventional manner even if the power supply of the main control unit 100 is disabled. The supplemental warning lamp 551 is used only for the supplemental control unit 150.

Hereinafter, the functions of the supplemental control unit 150 will be described in detail with reference to FIGS. 3, 4, and 5. When the supplemental control unit 150 senses an emergency shutdown signal for closing off the gas delivery path from the main control unit 100, it becomes operational. The main control unit 100 receives a gas leakage detection signal from the gas leakage detection unit (400 of FIG. 4) and generates an emergency shutdown signal through the D/O signal unit to the gas supply unit 200 so as to shut down all the valves (see 510 of FIG. 5).

However, the emergency shutdown signal may be generated not only in response to the foregoing gas leakage detection signal, but also in response to a malfunction or an error in the main control unit 100 which is affected by internal/external factors. If the emergency shutdown signal is generated due to an error in the main control unit 100, and the gas delivery path is immediately closed off, the operation of the manufacturing equipment 300 will automatically be stopped. Once the manufacturing equipment 300 is stopped, it is costly and troublesome to restart the manufacturing equipment 300.

To prevent unnecessary emergency shutdown of the manufacturing equipment 300, in one embodiment, the supplemental control unit 150 generates a signal for maintaining in a minimally open position the valves in the gas delivery path open in response to an emergency shutdown signal from the main control unit 100 (530 of FIG. 5). To maintain the valves in a minimally open position, at least V0 210, AV2B 240 and AV3B 260 in FIG. 3 may be open. The supplemental control unit 150 can prevent the emergency shutdown signal from closing off the gas delivery path and keep the gas delivery path minimally open. For this, the supplemental control unit 150 controls the valves in the gas delivery path, such as AV2B 240 and AV3B 260, as shown in FIG. 3, so as not to be completely shut (200' of FIG. 4). In addition, the supplemental control unit 150 turns on the supplemental warning lamp 551 coupled thereto, thereby informing the worker that the supplemental control unit 150 is being operated (550 of FIG. 5). While the supplemental control unit 150 is operated to maintain the gas delivery path minimally open, the main control unit 100 generates the emergency shutdown signal such that the warning lamp 550 is turned on and the display unit 500 indicates the occurrence of a malfunction.

The worker is warned by the warning lamps 550 and 551 and checks the gas delivery system to decide whether or not the emergency shutdown signal is normally generated (570). As a result, if gas leakage is actually detected by the gas leakage detection unit 400, the functions of the supplemental control unit 150 are cancelled, and the gas delivery path is closed off. That is, the operation for maintaining the gas delivery path including, for example, the valves V0 210, AV2B 240, and AV3B 260 of the container B open is cancelled such that all the valves of the gas supply unit 200 are shut by the emergency shutdown signal.

If it is decided that the emergency shutdown signal is generated by an error from the main control unit 100, for example, if it is decided that gas leakage is not detected by the gas leakage detection unit 200, the functions of the main control unit 100 are reset or restarted, thereby allowing normal operation of the main control unit 100. In this case, a normal operational signal emitted from the main control signal 100 cancels both the emergency shutdown signal and the minimally opened signal of the supplemental control unit 150. Then, while the main control unit 100 is being reset or restarted, the supplemental control unit 150 controls the gas supply unit 200 such that the gas continues to flow into the manufacturing equipment 300.

Since an emergency shutdown signal is typically generated by gas leakage, by abnormal high temperature, or by UV/IR sensors, the worker can typically decide promptly whether or not the main control unit 100 is operating normally based on obtaining such information, which is displayed on the display unit 500.

As described above, when the emergency shutdown signal is generated, the supplemental control unit 150 is preferably an auto recovery system (ARS), which enables the auto-recovery of the emergently shut gas delivery path. The ARS preferably performs an auto check function. Meanwhile, the supplemental control unit 150 can transmit/receive signals to/from the D/I signal unit and the D/O signal unit of the main control unit 100, and check the operating status of the main control unit 100.

As described above, in the gas delivery system of the present invention, when the emergency shutdown occurs or the emergency shutdown signal is generated in response to a malfunction of the main control unit 100, the supplemental control unit 150 allows for continuous gas supply to the manufacturing equipment 300. Afterwards, the supplemental control unit 150 gives the worker some time to decide whether the gas supply should be interrupted.

Meanwhile, the gas delivery system of this invention can be employed in conjunction with various semiconductor manufacturing equipment, such as diffusion equipment, low-pressure chemical vapor deposition (LPCVD) apparatuses, dry etch apparatuses, chemical vapor deposition (CVD) apparatuses, and photo apparatuses.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A gas delivery system for providing a gas to manufacturing equipment, comprising:
    a gas supply unit for providing the gas to the manufacturing equipment including devices to regulate the supply of gas from the gas supply unit to the manufacturing equipment;
    a main control unit for regulating the supply of the gas to the manufacturing equipment; and
    a supplemental control unit which receives an emergency shutdown signal from the main control unit for closing off the supply of gas in response to a malfunction of the main control unit and generates a signal for maintaining a gas flow to operate the manufacturing equipment until the cause of the malfunction has been determined.

2. The system of claim 1, which further includes a warning unit which cautions a worker regarding the malfunction so that the worker can determine the cause of the malfunction.

3. The system of claim 1, the supplemental control unit has an auto recovery function.

4. The system of claim 1, wherein the emergency shutdown signal generated from the main control unit comprises a command for closing off the flow of gas from the gas supply unit.

5. The system of claim 1, wherein the supplemental control unit provides for the gas to flow to the manufacturing equipment until the cause of the malfunction has been determined by a worker who then decides when to terminate the gas flow.

6. The system of claim 1, wherein the supplemental control unit is coupled to a signal output end of the main control unit so that when the main control unit outputs the emergency shutdown signal, the supplemental control unit receives the emergency shutdown signal.

7. The system of claim 1, wherein the devices to regulate the supply of gas from the gas supply unit to manufacturing equipment comprise on/off valves.

8. The system of claim 7, wherein the on/off valves comprise air operated on/off valves.

9. The system of claim 1, which further comprises a relay for independently supplying power to each of the supplemental control unit and the main control unit.

10. The system of claim 1, further comprising a supplemental power supply for providing power to the supplemental control unit independently of the main control unit.

11. The system of claim 10, wherein the supplemental control unit further comprises a warning unit which is coupled to the supplemental power supply for cautioning a worker of the malfunction.

12. The system of claim 2, wherein the warning unit is one of a display unit and a warning lamp for displaying the operating status of the main control unit.

13. The system of claim 1, further comprising a gas leakage detection unit for sensing a gas leakage and transmitting a gas leakage detection signal to the main control unit such that the main control unit generates the emergency shutdown signal.

14. The system of claim 1, further comprising a plurality of gas containers for storing the gas to be supplied to the manufacturing equipment.

15. A gas delivery system comprising:
a gas supply unit which includes a gas flow path for supplying a gas to manufacturing equipment, and a plurality of on/off valves installed along the gas flow path to control the gas stream passing through the gas flow path;
a main control unit for controlling the supply of gas from the gas flow path to the manufacturing equipment; and
a supplemental control unit which receives an emergency shutdown signal from the main control unit and generates a signal for keeping open the plurality of on/off valves for maintaining a gas flow to operate the manufacturing equipment until the cause of the malfunction has been determined.

16. The system of claim 15, wherein the emergency shutdown signal generated from the main control unit comprises a command for closing off the plurality of valves.

17. The system of claim 15, wherein the supplemental control unit has an auto recovery function.

18. The system of claim 15, further comprising a relay for independently supplying power to each of the supplemental control unit and the main control unit.

19. The system of claim 15, which further includes a warning unit which cautions a worker regarding the malfunction so that the worker can determine the cause of the malfunction.

20. A method for providing a gas to manufacturing equipment, comprising:
supplying and regulating a flow of the gas to the manufacturing equipment using a main control unit;
generating an emergency shutdown signal from the main control unit for closing off the supply of gas in response to a malfunction of the main control unit, the main control unit in communication with a supplemental control unit; and
generating a supplemental control signal for maintaining the gas flow to operate the manufacturing equipment from the supplemental control unit until the cause of the malfunction has been determined.

21. The method of claim 20, further comprising:
stopping the flow of gas to the manufacturing equipment if there is a gas leakage.

22. A fluid delivery system for providing a fluid to manufacturing equipment, comprising:
a fluid supply unit for providing the fluid to the manufacturing equipment including devices to regulate the supply of fluid from the fluid supply unit to the manufacturing equipment;
a main control unit for regulating the supply of the fluid to the manufacturing equipment; and
a supplemental control unit which receives an emergency shutdown signal from the main control unit for closing off the supply of fluid in response to a malfunction of the main control unit, the supplemental control unit generating a signal for maintaining a fluid flow to operate the manufacturing equipment until the cause of the malfunction has been determined.

* * * * *